US012562516B2

(12) United States Patent
Pallesen et al.

(10) Patent No.: US 12,562,516 B2
(45) Date of Patent: Feb. 24, 2026

(54) INPUT CONNECTOR WITH INTEGRATED RESIDUAL CURRENT DETECTION

(71) Applicant: Zaptec IP AS, Stavanger (NO)

(72) Inventors: Magnus Pallesen, Stavanger (NO); Knut Braut, Sandnes (NO); Fredrik Østrem, Sandnes (NO)

(73) Assignee: Zaptec IP AS, Stavanger (NO)

( * ) Notice: Subject to any disclaimer, the term of this patent is extended or adjusted under 35 U.S.C. 154(b) by 303 days.

(21) Appl. No.: 18/275,562

(22) PCT Filed: Feb. 4, 2022

(86) PCT No.: PCT/EP2022/052759
§ 371 (c)(1),
(2) Date: Aug. 2, 2023

(87) PCT Pub. No.: WO2022/167605
PCT Pub. Date: Aug. 11, 2022

(65) Prior Publication Data
US 2024/0120668 A1 Apr. 11, 2024

(30) Foreign Application Priority Data
Feb. 5, 2021 (NO) .................................... 20210153

(51) Int. Cl.
*H01R 9/24* (2006.01)
*B60L 1/00* (2006.01)
(Continued)

(52) U.S. Cl.
CPC .............. *H01R 9/2425* (2013.01); *B60L 1/00* (2013.01); *B60L 3/0069* (2013.01); *G01R 19/0092* (2013.01); *H01R 2201/26* (2013.01)

(58) Field of Classification Search
CPC ..... H01R 9/2425; H01R 2201/26; B60L 1/00; B60L 3/0069; G01R 19/0092
See application file for complete search history.

(56) References Cited

U.S. PATENT DOCUMENTS

| | | | | | |
|---|---|---|---|---|---|
| 6,074,240 | A | * | 6/2000 | Bradshaw ............ | H01R 4/2441 439/709 |
| 6,188,560 | B1 | * | 2/2001 | Waas ................... | H01R 4/2408 361/119 |

(Continued)

FOREIGN PATENT DOCUMENTS

| | | |
|---|---|---|
| CA | 3129042 A1 | 8/2020 |
| DE | 10-2015-002704 A1 | 9/2016 |

(Continued)

OTHER PUBLICATIONS

International Search Report issued in PCT/EP2022/052759 on Jun. 15, 2022 (6 pages).

(Continued)

*Primary Examiner* — Thanh Tam T Le
(74) *Attorney, Agent, or Firm* — Osha Bergman Watanabe & Burton LLP

(57) ABSTRACT

An input connector assembly, which is for detecting residual current and adapted for connecting power sources to electric equipment of electric vehicles, includes a wire terminal block, lock and release mechanisms, a residual current sensor, and a support holder. The wire terminal block has wire terminals for receiving electrical wires. The lock and release mechanisms are connected to the wire terminal block for fixing electrical wires to conductors in the wire terminals. The residual current sensor is adapted to be mounted to a flat surface. The support holder is designed to be placed above the residual current sensor and to be connected to the flat surface. The support holder is further adapted for supporting the wire terminal block in a position above the residual current sensor. Conducting connection pins run from the conductors in the wire terminals through openings in the residual current sensor to the flat surface.

3 Claims, 2 Drawing Sheets

(51) Int. Cl.
     *B60L 3/00*          (2019.01)
     *G01R 19/00*         (2006.01)

(56)                References Cited

U.S. PATENT DOCUMENTS

| 6,497,592 | B1 * | 12/2002 | Beadle | H01R 9/2425 |
| | | | | 439/814 |
| 6,769,939 | B2 * | 8/2004 | Neumann | H01R 27/02 |
| | | | | 439/721 |
| 6,811,430 | B1 * | 11/2004 | Carrico | H01R 9/2408 |
| | | | | 439/409 |
| 7,004,781 | B2 * | 2/2006 | Walter | H01R 4/4833 |
| | | | | 439/441 |
| 7,094,071 | B2 * | 8/2006 | Hackemack | H01R 4/4823 |
| | | | | 439/761 |
| 7,110,534 | B1 * | 9/2006 | Mullaney | H04Q 1/028 |
| | | | | 379/325 |
| 7,402,075 | B1 * | 7/2008 | Probst | H01R 4/2433 |
| | | | | 439/410 |
| 7,909,633 | B1 * | 3/2011 | Miller | H01R 4/366 |
| | | | | 439/441 |
| 8,998,658 | B2 * | 4/2015 | Borst | H01R 4/48 |
| | | | | 439/867 |
| 9,240,650 | B2 * | 1/2016 | Wu | H01R 4/483 |
| 9,413,082 | B2 * | 8/2016 | Gassauer | H01R 4/48 |
| 9,466,897 | B1 * | 10/2016 | Wu | H01R 9/2491 |
| 10,249,964 | B1 * | 4/2019 | Wu | H01R 9/2425 |
| 10,283,880 | B2 * | 5/2019 | Kettern | H01R 4/483 |
| 10,381,754 | B1 * | 8/2019 | Wu | H01R 13/6275 |
| 10,490,916 | B1 * | 11/2019 | Wu | H01R 4/4821 |
| 10,574,150 | B2 * | 2/2020 | Yamanaka | H01R 9/2425 |
| 10,680,359 | B2 * | 6/2020 | Geske | H01R 12/585 |
| 11,043,759 | B2 * | 6/2021 | Ober-Woerder | H01R 13/187 |
| 11,289,845 | B2 * | 3/2022 | Geske | H01R 4/483 |
| 11,621,504 | B2 * | 4/2023 | Moser | H01R 4/483 |
| | | | | 439/709 |
| 11,777,245 | B2 * | 10/2023 | Phon | H01R 9/2408 |
| | | | | 439/748 |
| 2011/0148355 | A1 | 6/2011 | Nakamura et al. | |
| 2013/0040177 | A1 | 2/2013 | Hashio et al. | |

FOREIGN PATENT DOCUMENTS

| JP | 2009-240053 A | 10/2009 |
| WO | 2020/167141 A1 | 8/2020 |

OTHER PUBLICATIONS

Written Opinion of the International Searching Authority issued in PCT/EP2022/052759 on Jun. 15, 2022 (10 pages).
Norwegian Search Report issued in No. 20210153 mailed on Sep. 2, 2021 (2 pages).

* cited by examiner

INPUT CONNECTOR WITH INTEGRATED RESIDUAL CURRENT DETECTION

TECHNICAL FIELD

The invention relates to electrical installation equipment, and more specifically to an input connector provided with residual current detection means and where this is adapted for electric vehicles equipment.

BACKGROUND

Electrical vehicles have become increasingly popular and as such, there is a range of different electric equipment available on the market. This range from charging solutions for charging batteries of electric vehicles to electric equipment installed in the vehicles.

Residual current devices (RCDs) are typically used in electrical installations in homes to protect against risks such as electric shock and fires. When activated, electrical power supplied to a specific fuse will be cut off. Activation occurs when leakage of electrical current to ground is detected.

Residual current detection is also a vital part of the equipment related to electric vehicles. Known systems measure residual current by passing power input phases through a sensor. Such solutions do however add a significant amount of power loss and possibly also contribute to the complexity of assemblies.

The present invention addresses this problem. A solution with minimal power loss is provided by means of the constructional features of an input connector with an integrated RCD sensor. The solution enables easy assembly and the input connector has minimal size.

SUMMARY

The invention is defined by an input connector assembly for detecting residual current and adapted for connecting power sources to electric equipment of electric vehicles, comprising a wire terminal block with wire terminals for receiving electrical wires, lock and release mechanism connected to the wire terminal block for fixing electrical wires to conductors in the wire terminals.

The input connector assembly further comprises a residual current sensor adapted to be mounted to a flat surface and a support holder designed to be placed above the residual current sensor and to be connected to the flat surface, and were the support holder is further adapted for supporting the wire terminal block in a position above the residual current sensor, and where conducting connection pins runs from the conductors in the wire terminals through openings in the residual current sensor to the flat surface.

Further characteristics of the invention are defined in the claims.

DETAILED DESCRIPTION

The invention will now be described with reference to the figures.

Figure 1:
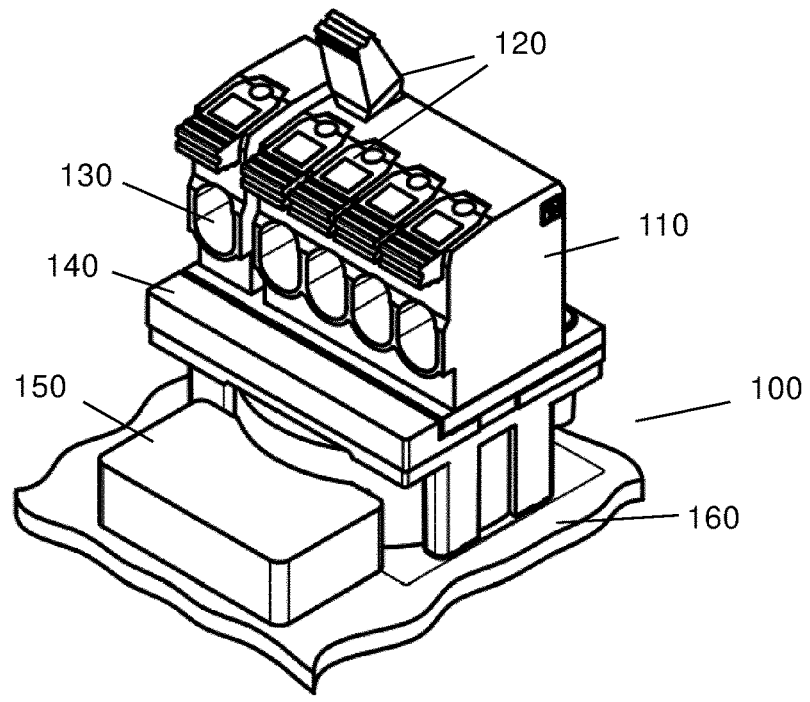
FIG. 1 is a perspective view of a front side of an input connector assembly according to the invention.
Figure 2:
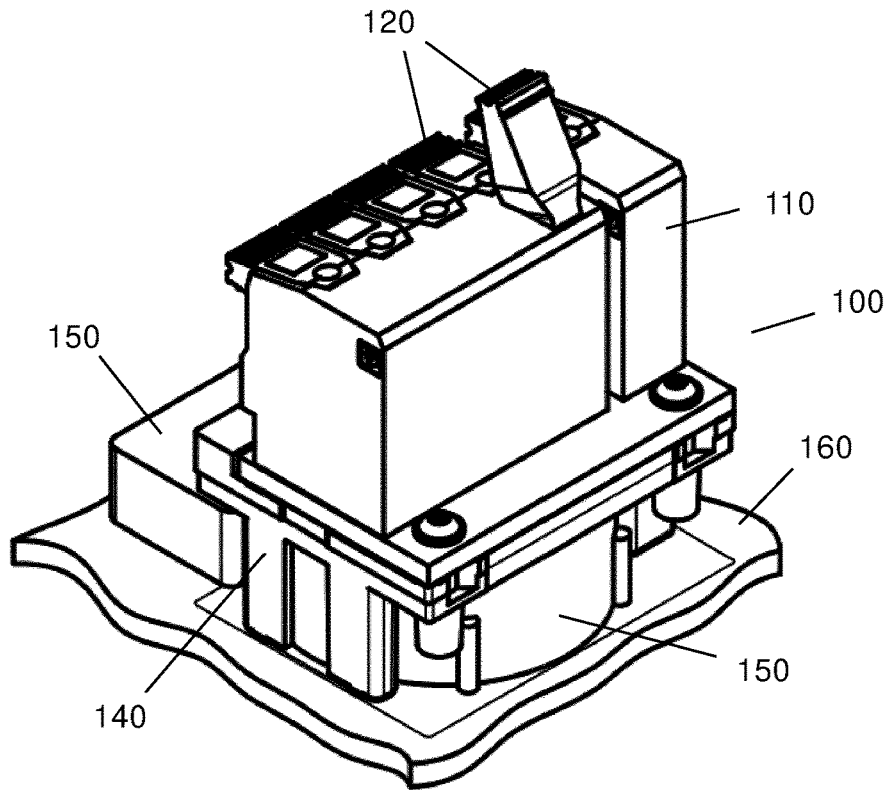
FIG. 2 is a perspective view of a back side of an input connector assembly according to the invention.

FIGS. 1 and 2 show front and back sides of the input connector assembly 100. The figures show the different parts making the connector assembly 100 and how the parts are connected relative to and to each other for detecting residual current from wires connected to wire terminals 130 of a wire terminal block 110. Each wire terminal 130 is provided with a lock and release mechanism 120, typically a handle, connected to the wire terminal block 110 for fixing electrical wires to conductors in the wire terminals 130.

A residual current sensor 150 is connected to a flat surface 160, typically a printed circuit board (PCB). A support holder 140 having a hollow design enabling it to be positioned above the residual current sensor 150 as shown in the figures. The support holder 140 is also connected to the same flat surface 160. The top of the support holder is adapted to support the wire terminal block 110. The residual current sensor 150, support holder 140 and the wire terminal block 110 will thus be placed above each other. Conducting connection pins 170 run from the conductors in the wire terminals 130 through openings in the residual current sensor 150 to the flat surface.

This compact construction of the input connector assembly 100 makes it possible to detect residual current between conductors without connecting a residual current detector directly to the wires conducting power.

In one embodiment of the invention, the input connector assembly 100 further comprises a distribution circuit board 180 adapted for distribution of connectors running from the wire terminals 130 to respective openings in the current sensor 150.

Figure 3:
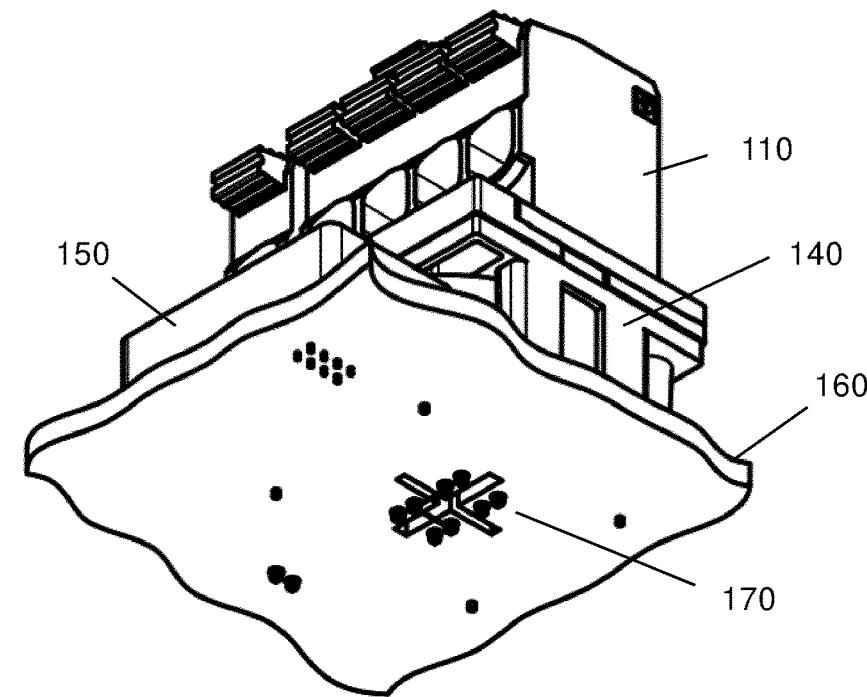
FIG. 3 is a perspective view of a bottom side of an input connector assembly according to the invention.

FIG. 3 shows a bottom side of an input connector assembly according to the invention. This figure illustrates how the support holder 140 is connected to the flat surface 140, e.g. by connecting the conducting connection pins 170 to a PCB by using press-fit or soldering or a combination of these techniques.

Figure 4:
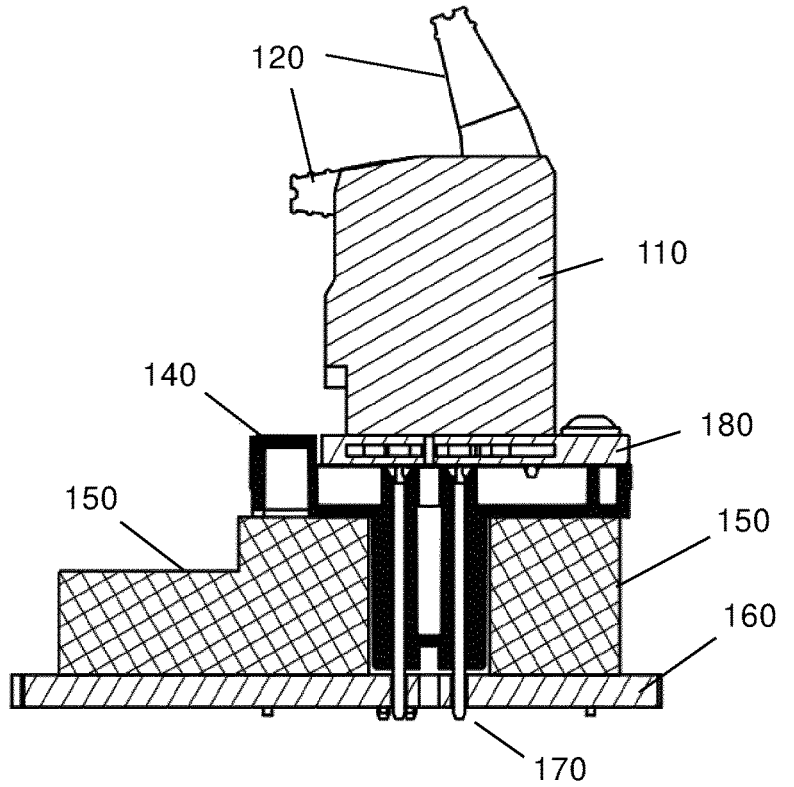
FIG. 4 is a side view showing details of an input connector assembly according to the invention.

FIG. 4 shows details of an input connector assembly, where the conducting connection pins 170 run from the distribution circuit board 180 through the flat surface, e.g. to corresponding conductors of the PCB.

As understood from the above, the invention provides a compact input connector assembly for detecting residual currents. The construction is easy to assemble, has minimal size. The assembly can be built by robots, thereby minimizing assembly costs. In addition, the total power loss is kept as low as possible by using few parts in the current carrying path.

The invention claimed is:

1. An input connector assembly for detecting residual current and adapted for connecting power sources to electric equipment of electric vehicles, the input connector assembly comprising:

a wire terminal block with wire terminals for receiving electrical wires;

lock and release mechanisms connected to the wire terminal block for fixing electrical wires to conductors in the wire terminals;

a residual current sensor adapted to be mounted to a flat surface;

a support holder having a hollow design enabling the support holder to be positioned above the residual current sensor and to be connected to the flat surface, wherein a top of the support holder is adapted for supporting the wire terminal block in a position entirely above the residual current sensor, and wherein conducting connection pins run from each conductor in the wire terminals through openings in the residual current sensor to the flat surface.

2. The input connector assembly according to claim 1, further comprising a distribution circuit board adapted for distribution of connectors running from the wire terminals to respective openings in the current sensor.

3. The input connector according to claim 1, wherein the flat surface is a printed circuit board.

\* \* \* \* \*